United States Patent [19]
Galloway

[11] Patent Number: 5,886,414
[45] Date of Patent: *Mar. 23, 1999

[54] REMOVAL OF EXTENDED BOND PADS USING INTERMETALLICS

[75] Inventor: Terry R. Galloway, San Jose, Calif.

[73] Assignee: Integrated Device Technology, Inc., Santa Clara, Calif.

[*] Notice: The term of this patent shall not extend beyond the expiration date of Pat. No. 5,783,868.

[21] Appl. No.: 717,411

[22] Filed: Sep. 20, 1996

[51] Int. Cl.$^6$ .......................... H01L 23/48; H01L 29/54; H01L 23/485
[52] U.S. Cl. .......................... 257/784; 257/737; 257/786; 257/781; 257/673
[58] Field of Search .................... 257/737, 738, 257/784, 781, 786, 735, 673

[56] References Cited

U.S. PATENT DOCUMENTS

| | | | |
|---|---|---|---|
| 3,973,271 | 8/1976 | Okumura et al. | 357/34 |
| 4,622,574 | 11/1986 | Garcia | 357/55 |
| 4,693,770 | 9/1987 | Hatada | 156/157 |
| 4,951,098 | 8/1990 | Albergo et al. | 357/17 |
| 4,959,706 | 9/1990 | Cusack et al. | 357/68 |
| 4,984,065 | 1/1991 | Sako | 257/784 |
| 5,053,850 | 10/1991 | Baker et al. | 357/68 |
| 5,156,997 | 10/1992 | Kumar et al. | 437/183 |
| 5,367,763 | 11/1994 | Lam | 29/827 |
| 5,384,488 | 1/1995 | Golshan et al. | 257/786 |
| 5,394,013 | 2/1995 | Oku et al. | 257/786 |
| 5,404,045 | 4/1995 | Mizushima | 257/698 |
| 5,483,741 | 1/1996 | Akram et al. | 29/846 |
| 5,508,228 | 4/1996 | Nolan et al. | 437/183 |
| 5,508,229 | 4/1996 | Baker | 437/183 |
| 5,517,127 | 5/1996 | Bergeron et al. | 324/760 |
| 5,541,446 | 7/1996 | Kierse | 257/666 |
| 5,631,499 | 5/1997 | Hosomi et al. | 257/737 |
| 5,640,762 | 6/1997 | Farnworth et al. | 29/833 |
| 5,742,100 | 4/1998 | Schroeder et al. | 257/778 |

*Primary Examiner*—Peter Toby Brown
*Assistant Examiner*—Hung Van Duong
*Attorney, Agent, or Firm*—Majestic, Parsons, Siebert & Hsue

[57] ABSTRACT

Removable extension areas electrically connected to the original die bond pad allow for testing connections to be made. After removal of the extension areas, the circuitry below the region of the extension areas can be seen through a microscope. The use of perforations and/or underlayer sections can aid in the removal of the extension areas. Underlayer sections may comprise a metal that forms an intermetallic interaction with the metal layer of the extension areas.

30 Claims, 5 Drawing Sheets

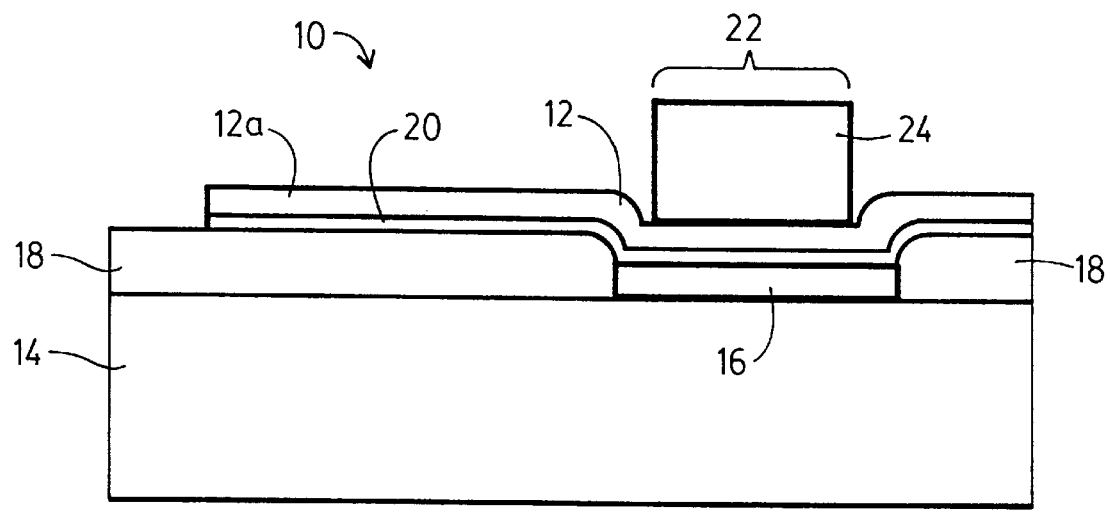
FIG._1.
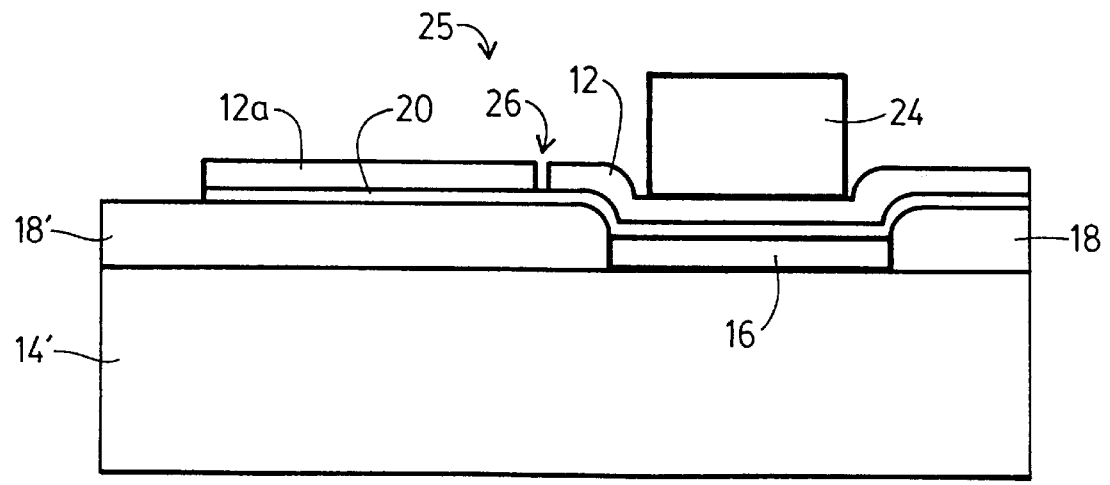
FIG._2.

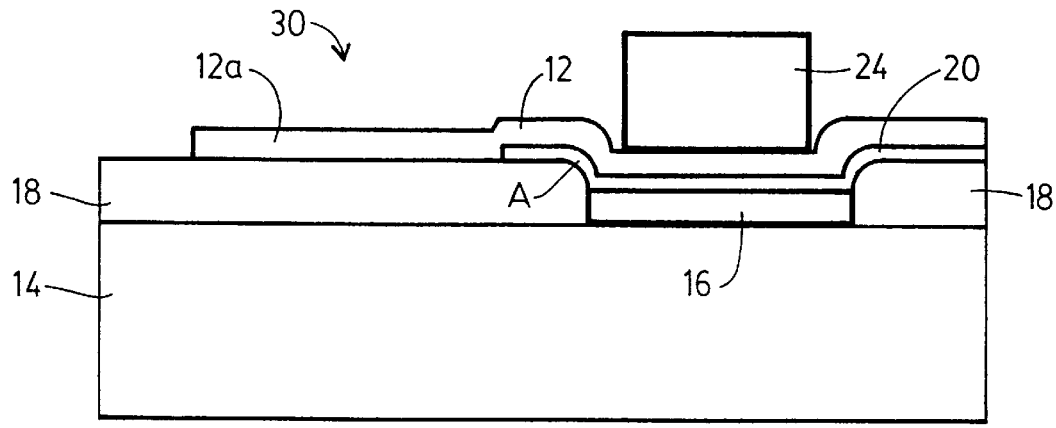
FIG._3.
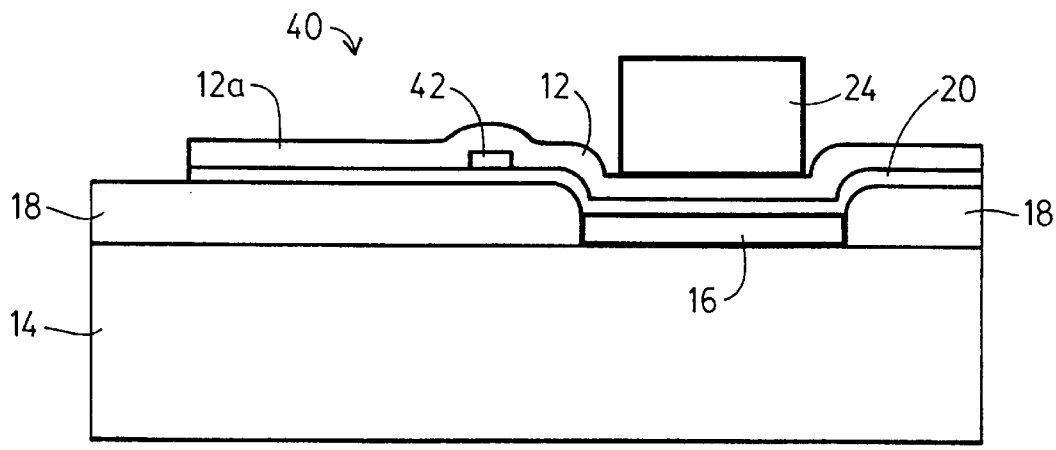
FIG._4.
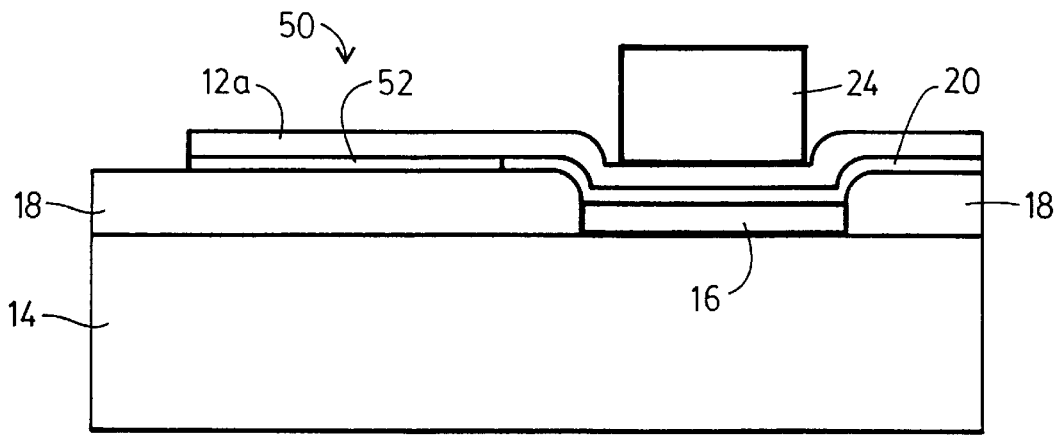
FIG._5.

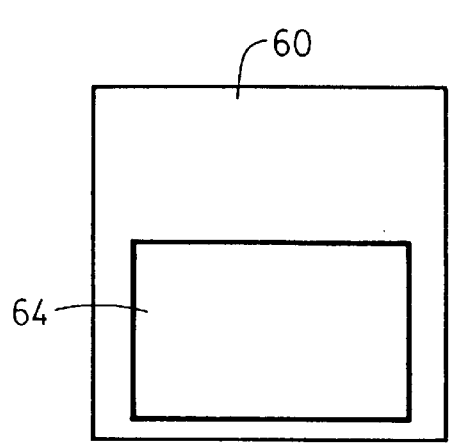
FIG._6A.
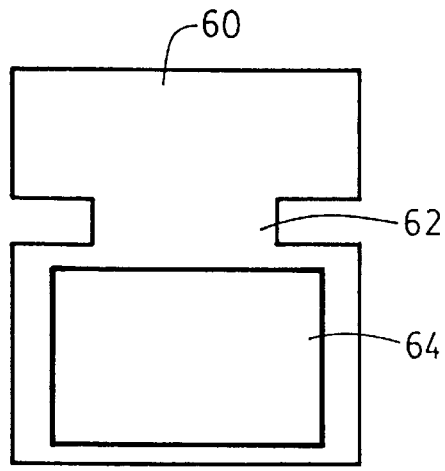
FIG._6B.
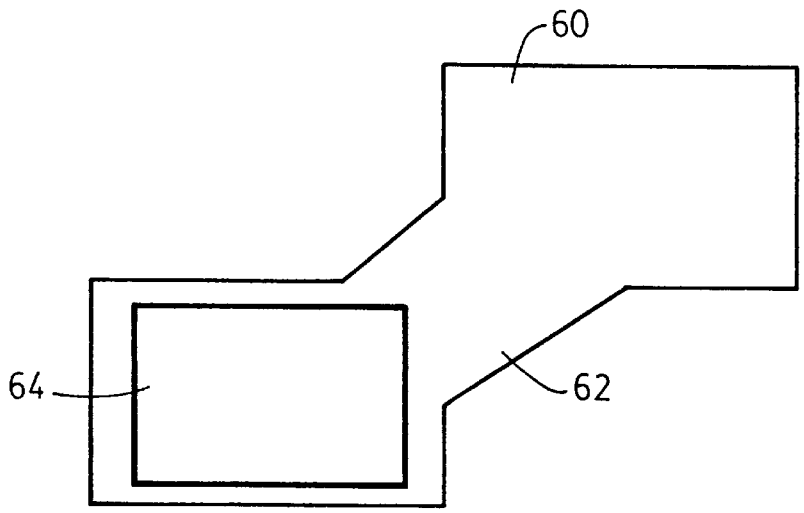
FIG._6C.
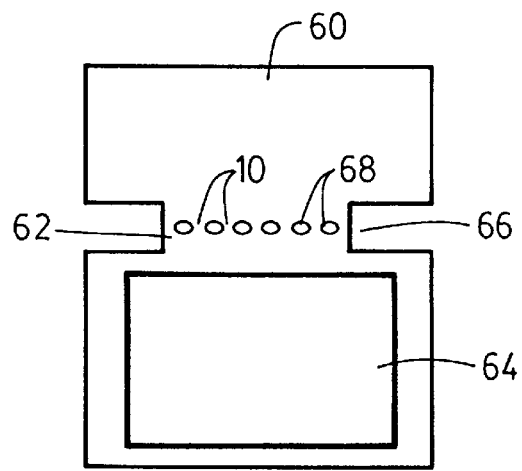
FIG._7.

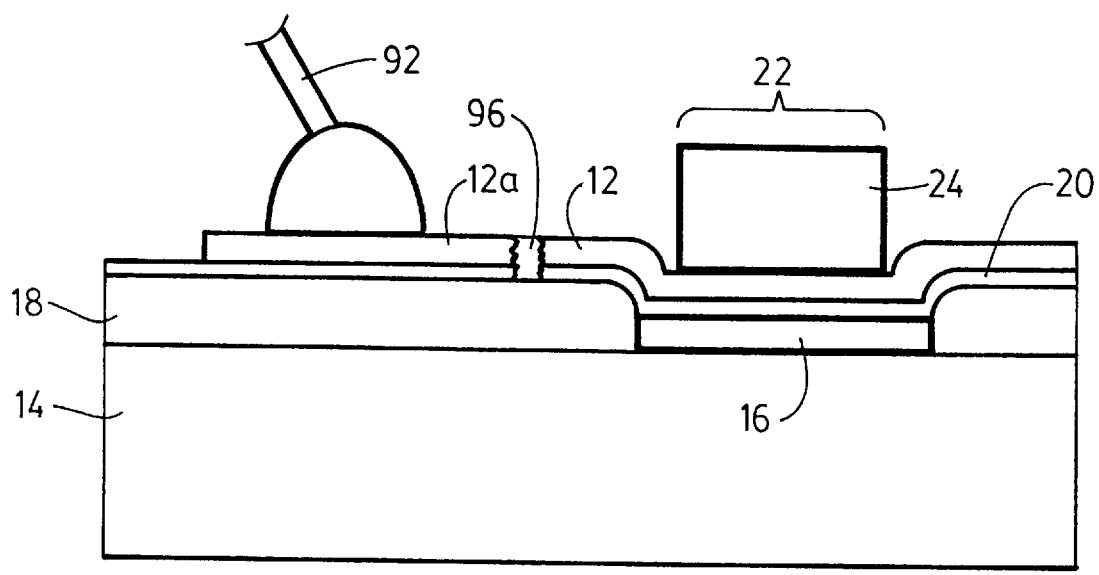
FIG._8A.
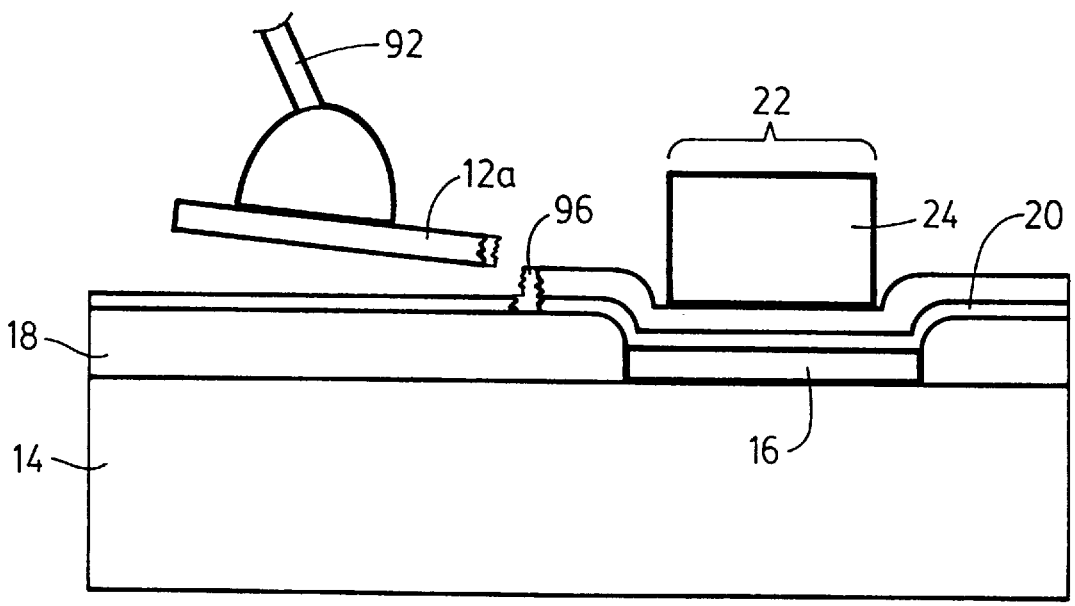
FIG._8B.

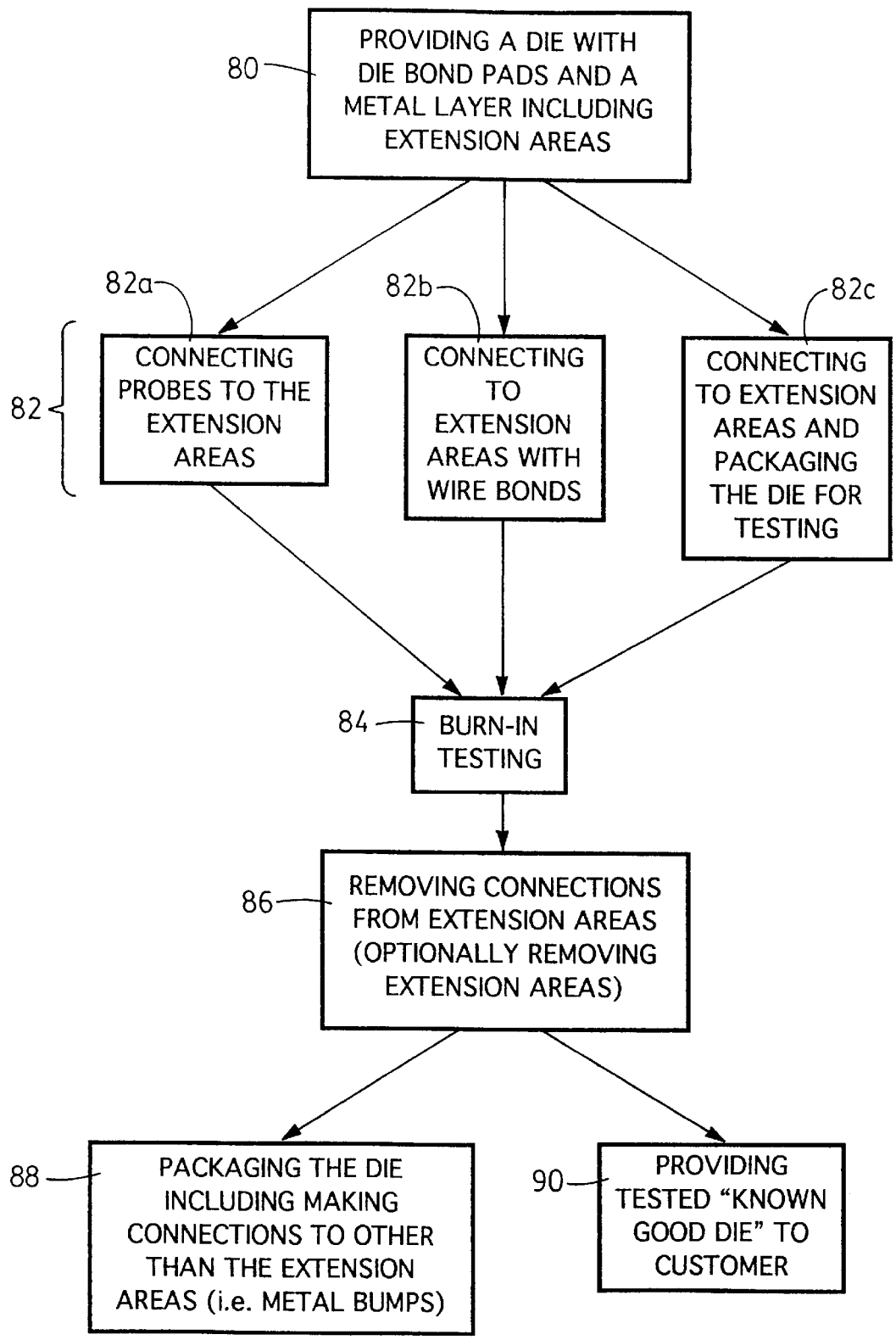
FIG._9.

REMOVAL OF EXTENDED BOND PADS USING INTERMETALLICS

BACKGROUND OF THE INVENTION

This invention relates to a method and apparatus for packaging a semiconductor die.

Burn-in testing is used to force infant mortality and cause latently defective chips to fail early in the manufacturing process. By forcing chip failure, the chip manufacturer can avoid unnecessary expenditure of time and money on latently defective or "bad" chips. Another valuable aspect of burn-in testing is that it provides an ongoing evaluation of the fabrication process. The burn-in testing can be static or dynamic. Static testing typically supplies power and ground to a chip which is cycled through different temperature ranges. In dynamic burn-in testing, test signals are also applied to the chips to exercise specific chip functions.

The burn-in testing requires electrical connections to the circuit. Electrical connections to the chip for burn-in testing can be made with probe cards or with wire bond connections. Probe cards use a large number of thin electrical probes which must make electrical contact with each input pad on the chip to supply the excitation signal to the particular circuitry associated with that pad. The probe card contacts can damage the input pads.

Alternately, wire bond connections can be used. Dies can be packaged, burn-in tested, and then removed from the package. The electrical connections used for burn-in testing can sometimes damage a contact area or wire bond pad of the die. In some cases, this damage can prevent a tested die from being re-packaged and/or used.

It is therefore advantageous to have a packaging method and apparatus which avoids the problem of damage to the contact area.

SUMMARY OF THE INVENTION

The present invention uses extension areas electrically connected to but extending beyond the original wire bond pads. The extension areas allow for an electrical connection with the original wire bond pad for burn-in testing. These testing connections can be removed without damaging regions on the die used for the final packaging connections.

The extension areas preferably extend over a passivation layer so that the addition of the extension areas does not require a modification of the basic die design. That is, the same basic die design can be used either with the extension areas or without the extension areas. An expensive die redesign is not required.

The extension areas are preferably part of a metal layer. In a preferred embodiment, a barrier layer is placed between this metal layer and the original die bond pad.

Military electronics specifications require that the circuitry be visible through the passivation layer with a microscope. Thus, for military applications, it would be advantageous that the opaque extension areas be removable. The extension areas can optionally be removed along with the testing connections following burn-in testing in several different ways. One way is to form perforations in the metal layer. The perforations are openings created when the metal layer is formed and are preferably oval or circular shaped. These openings reduce the amount of metal along the perforation line, and thus facilitate removal of the extension areas. Alternatively, the barrier layer need not be placed underneath the metal layer at the extension areas. Additionally, an underlayer that provides a weak contact with the metal layer, i.e., an epoxy or polyimide, could be used. Finally, an underlayer that weakens a portion of the metal layer can be used. For example, if the metal layer includes gold, an underlayer of aluminum will cause an intermetallic interaction that can weaken the metal layer.

In systems that use secondary mask bumps, the metal layer allows for a contact region away from the metal bump. In this way, the metal bump is not damaged as a result of the testing connections.

BRIEF DESCRIPTION OF THE DRAWINGS

The above and other features of the present invention will become more apparent upon the reading of the following detailed description in conjunction with the accompanying drawings, in which:

FIG. 1 is a cross-sectional view of the structure of the present invention showing extension areas of a metal layer extending over the passivation layer.

FIG. 2 is a cross-sectional view of the structure of the present invention showing perforations used to aid in the removal of the extension area.

FIG. 3 is a cross-sectional view of the structure of the present invention wherein no barrier layer is placed under portions of the extension area.

FIG. 4 is a cross-sectional view showing the structure of the present invention with a metallic underlayer which aids in the removal of the extension areas.

FIG. 5 is a cross-sectional view of the structure of the present invention showing an underlayer that provides a weak contact with the metal layer to aid in the removal of the extension areas.

FIGS. 6A–6C are top views of metal layers showing different designs of the extension areas.

FIG. 7 is a top view of a metal layer showing an extension area which includes perforations to aid in its removal.

FIG. 8A is a cross-sectional view showing a structure of the present invention with a wire bond connecting to the extension region.

FIG. 8B is a cross-sectional view showing a structure of the present invention with the extension region being removed along with the wire bond.

FIG. 9 is a flow chart showing the method of the present invention.

DETAILED DESCRIPTION OF THE PREFERRED EMBODIMENT

FIG. 1 is a cross-sectional view of the structure 10 of the present invention including a metal layer 12 with an extension area 12a. Shown in FIG. 1 is a die 14 with its associated layers including an original wire bond pad 16 and passivation layer 18. The original wire bond pad 16 is typically made of aluminum, an aluminum/silicon alloy or an aluminum/silicon/copper alloy. The passivation layer 18 is made of a dielectric material and is typically formed of oxide and/or nitride layer(s). In one embodiment, the passivation layer 18 is made of silicon dioxide. The die 14 with the original die bond pad 16 and passivation layer 18 can be hermetically packaged.

In the present invention, additional structures are added to the die to aid in producing known-good-die. Metal layer 12 is electrically connected to the original die bond pad 16. The metal layer 12 extends beyond the original wire bond pad 16 to form the extension area 12a. The metal layer 12 is preferably positioned over the passivation layer 18. This metal layer 12 is preferably formed of a gold or solder material. The metal layer 12 is deposited as thin layer. In a preferred embodiment, a barrier layer 20 such as titanium/ tungsten can be placed between the original die bond pad 16 and the additional metal layer 12. The barrier layer prevents an intermetallic interaction between the metal layer and the original wire bond pad 16. Otherwise a metal layer 12 of gold that directly contacts an original wire bond pad 16 of aluminum will generate an undesirable intermetallic interaction.

Since the extension area 12a preferably extends over portions of the passivation layer 18, the area for electrically contacting the die is increased without changing the die design. If the original die bond pad were to be increased in size, an expensive re-design of the die would be required. The extension area 12a is preferably large enough to be connected with wire bonds. The minimum size of the extension area that would allow connection with a wire bond is currently a square about 50–100 microns on a side. Thus, the extension area preferably has an area 10,000 square microns or less, and an area preferably in the range of 2500–10,000 square microns. The extension area can be made smaller as the packaging connection area requirements are reduced in the future.

Connections to the extension area 12a can be removed and final packaging connections can be made to the area 22 above the original wire bond pad 16. optionally, a metal bump 24 can be produced in the area 22. This metal bump 24 is preferably made of gold. The metal bump 24 allows the die to be used in a flip chip or tape-automated-bonding (TAB) package. Additionally, the metal bump 24 can be created in a multi-bump process. The metal layer 12 is preferably made of material compatible with the material of the metal bump 24. In a preferred embodiment, both the metal layer 12 and the metal bump 24 are made of gold.

Prior to formation of metal layer 12, a barrier layer 20 may optionally be provided. The barrier layer 20 can be deposited over the entire die surface. Patterned photoresist (not shown) is placed on top of the barrier layer 20, and the metal layer 12 is formed in a thin metal deposition. In one embodiment, the metal layer 12 is a 3 micron thick deposition of gold. An additional layer of patterned photoresist is placed on the device, and the metal deposition for the metal bump 24 is done. In one embodiment, the metal bump 24 is formed in a 25 micron thick deposition of gold. Next, both the photoresist layers and the metal deposited on the photoresist layers are removed, leaving the metal layer 12 and the metal bump 24. A weak etch to the entire die surface can remove the barrier layer 20 at locations not covered by the metal layer 12.

In one embodiment, the extension areas can be detached when the test connections are removed from the die. For example, if wire bonds connect to the extension area for testing, the wire bond connection can be stronger than the connection of the extension area to the die so that the extension areas can be removed from the die by simply pulling on the wire bonds. Having a relatively weak connection between the extension area and the die enhances this effect.

FIGS. 2–5 illustrate structures which aid in detaching the extension areas. Many of the techniques described in FIGS. 2–5 can be combined.

FIG. 2 is a cross-sectional view of structures of the present invention showing a perforation at area 26. The perforations can be formed by using photoresist to produce openings juxtaposed in a line across the width of metallic layer 12. The perforation line is best seen with respect to FIG. 7 discussed below. The perforations facilitate removal of the extension area 12a.

FIG. 3 is a cross-sectional view of the structure 30 of the present invention showing an extension area 12a without a barrier layer underneath. By omitting the barrier layer 20 underneath the extension area 12a, the removal of the extension area 12a may be made easier. Alternately, the edge of the barrier layer may terminate at point A. The structure of FIG. 3 requires a photoresist patterning step before the deposition of the barrier layer 20.

FIG. 4 is a cross-sectional view of a structure 40 including an underlayer 42. In this embodiment, a metal underlayer 42 is supplied below the metal layer 12. The metal underlayer comprises a metal material that forms a relatively weak alloy with the metal in the metal layer. This intermetallic interaction will weaken portions of the metal layer 12, thus making the extension area 12a easier to remove. In one embodiment, an underlayer 42 made of aluminum causes an intermetallic interaction with the metal layer 12 made of gold. The gold migrates into the aluminum region, forming a relatively weak gold/aluminum intermetallic region (not shown). Voids or pits in this contact region may also be formed by the intermetallic process. The intermetallic interaction can be facilitated by heating the dies. In a preferred embodiment, the dies can be heated to 200° C.–300° C. for about an hour.

Alternately, if the metal layer 12 is made of copper, the underlayer can be a metal that forms an intermetallic interaction with copper.

FIG. 5 is a cross-sectional view of the structure 50 of the present invention showing an underlayer 52. Underlayer 52 forms a weak contact with the extension area 12a. The weak contact makes it easier for the extension area 12a to be removed. Underlayer 52 is preferably made of an epoxy or polyimide.

FIGS. 6A–C are top views of the present invention illustrating the different locations for the extension area 60. Note that FIGS. 6B and 6C use a narrow portion 62 which aids in the removal of the extension areas 60. Also shown in these figures is the optional metal bump 64.

FIG. 7 is a top view of structure of the present invention showing a perforation line 66 at the narrow region 62. The perforation line 66 includes openings 68 and metal regions 70.

FIG. 8A is a cross-sectional view showing the structure of the present invention with a wire bond 92 connecting to the extension region 12a. The connection to the extension region 12a can be used to burn-in test the die. An intermetallic region 96 is formed where a metallic underlayer contacts a portion of the metal layer 12.

FIG. 8B is a cross-sectional view showing the structure of the present invention with the extension region 12a being removed along with the wire bond 92. When the wire bond 92 is removed after burn-in testing, the extension area 12a peels away from the barrier layer 20 or the passivation layer 18. Because the intermetallic region 96 is weak and brittle, the extension area 12a detaches from the remainder of the metal layer 12 at the intermetallic region 96. If perforations (not shown) are formed in the metal layer, the extension area 12a will detach from the remainder of the metal layer 12 along the perforations (not shown). Perforations can be used by themselves or in conjunction with the intermetallic region. With the extension area 12a removed, the circuity below passivation layer 18 can be visually inspected. The final packaging connections can be made to the area 22 which has been untouched by the testing connection (i.e.

wire bond 92). A detachment region can comprise the perforations and/or the intermetallic region. This detachment region prevents the metal layer from peeling back at area 22.

FIG. 9 is a flow chart illustrating the method of the present invention. In step 80, a die with die bond pads and a metal layer including extension areas is provided. This step is described above. Next, electrical connections are made to the extension areas in step 82. This step can be done by connecting a probe to the extension areas in step 82a, connecting to extension areas with wire bonds to a test substrate in step 82b, or connecting to the extension areas and packaging the die for testing in step 82c. Step 84 comprises the burn-in testing of the die. In step 86, the connections are removed from the extension areas. The extension areas can optionally be removed. At this point, the known-good-dies could be packaged making connections to locations other than the extension areas, in step 88. This packaging could be done with connections to the metal bumps. Since the previous testing connections were made to the extension areas, there remains an undamaged region to make electrical connections for the final packaging. Alternatively, in step 90, the unpackaged known-good-die could be provided to the customer.

Another alternative is for the dies to be tested while they are on the wafer before the dies on the wafer are separated.

Various details of the implementation and method are merely illustrative of the invention. It will be understood that various changes in such details may be within the scope of the invention, which is to be limited only by the appended claims.

What is claimed is:

1. A structure comprising:
   a die;
   a wire bond pad on the die;
   an extension area electrically connected to the wire bond pad, the extension area comprising a first type of metal, the extension area extending, beyond the area of the wire bond pad;
   a barrier layer separating the wire bond pad and the extension area, wherein said barrier layer is electrically conductive; and
   an intermetallic region connected to the extension area, the intermetallic region including an alloy of the first type of metal and another type of metal.

2. The structure of claim 1, wherein the first metal is gold and the second metal is aluminum.

3. The structure of claim 1, wherein the extension area forms a connection with a wire bond.

4. The structure of claim 1, wherein the extension area has a surface area of 10,000 square microns or less.

5. The structure of claim 4, wherein the extension area has a surface area of 2500 square microns or greater.

6. The structure of claim 1, further comprising a metal bump electrically connected to the wire bond pad, the metal bump not positioned over the extension area.

7. The structure of claim 1, wherein the metal layer includes a plurality of perforations at the intermetallic region.

8. A structure comprising:
   a die;
   a wire bond pad on the die;
   a metal layer electrically connected to the wire bond pad, the metal layer including an extension area extending beyond the area of the wire bond pad, the extension area connected to the remainder of the metal layer through a detachment region; and
   a barrier layer separating the wire bond pad and the metal layer, wherein said barrier layer is electrically conductive.

9. The structure of claim 8, wherein the detachment region comprises a plurality of perforations in the metal layer.

10. The structure of claim 8, wherein the extension area comprises a first metal and the detachment region comprises an intermetallic region including an alloy of the first metal and a second metal.

11. The structure of claim 10, wherein the first metal is gold and the second metal is aluminum.

12. The structure of claim 8, wherein the extension area forms a connection with a wire bond.

13. The structure of claim 8, wherein the extension area has a surface area of 10,000 square microns or less.

14. The structure of claim 13, wherein the extension area has a surface area of 2500 square microns or greater.

15. The structure of claim 8, further comprising a metal bump on the metal layer, the metal bump not positioned over the extension area.

16. The structure of claim 8, further comprising an underlayer located below a portion of the metal layer.

17. The structure of claim 16, wherein the metal layer has a weaker contact strength with the underlayer than with a passivation layer on the die.

18. The structure of claim 8, wherein the barrier layer does not extend under a portion of the metal layer.

19. The structure of claim 8, wherein the extension area has a region wider than the detachment region.

20. A structure comprising:
    a die;
    a wire bond pad on the die;
    an extension area electrically connected to the wire bond pad, the extension area comprising a first type of metal, the extension area extending beyond the area of the wire bond pad;
    an intermetallic region connected to the extension area, the intermetallic region including, an alloy of the first type of metal and another type of metal;
    a barrier layer separating the wire bond pad and the intermetallic region, wherein said barrier layer is electrically conductive; and
    a metal bump on the intermetallic region, the metal bump not positioned over the extension area.

21. The structure of claim 20, further comprising:
    an underlayer located below a portion of the extension area.

22. The structure of claim 21, wherein the extension area has a weaker contact strength with the underlayer than with a passivation layer on the die.

23. The structure of claim 20, wherein the barrier layer does not extend under a portion of the extension area.

24. The structure of claim 20, wherein the extension area has a region wider than the detachment region.

25. The structure of claim 20, wherein the first type of metal is gold and the another type of metal is aluminum.

26. The structure of claim 20, wherein the extension area forms a connection with a wire bond.

27. The structure of claim 20, wherein the extension area has a surface area of 10,000 square microns or less.

28. The structure of claim 20, wherein the extension area has a surface area of 2500 square microns or greater.

29. The structure of claim 20, further comprising a metal bump electrically connected to the wire bond pad, the metal bump not positioned over the extension area.

30. The structure of claim 20, wherein the metal layer includes a plurality of perforations at the intermetallic region.

* * * * *